(12) United States Patent
Jourde et al.

(10) Patent No.: US 6,343,784 B1
(45) Date of Patent: Feb. 5, 2002

(54) DEVICE ALLOWING THE TREATMENT OF A SUBSTRATE IN A MACHINE PROVIDED FOR THE TREATMENT OF BIGGER SUBSTRATES AND A SYSTEM OF MOUNTING A SUBSTRATE IN THIS DEVICE

(75) Inventors: Dominique Jourde, Seyssins; Gérard Turc, Echirolles, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/400,820

(22) Filed: Sep. 21, 1999

(30) Foreign Application Priority Data

Sep. 25, 1998 (FR) .............................. 98 12002

(51) Int. Cl.⁷ ................................. B23Q 3/00
(52) U.S. Cl. .................. 269/287; 269/900; 269/289 R; 269/293; 451/365; 451/364
(58) Field of Search ................ 269/287, 900, 269/289 R, 903, 293; 451/364, 365, 378, 386

(56) References Cited

U.S. PATENT DOCUMENTS

| | | |
|---|---|---|
| 5,093,550 A | 3/1992 | Gerber et al. |
| 5,195,729 A * | 3/1993 | Thomas et al. ............. 269/289 R |
| 5,280,894 A * | 1/1994 | Witcraft et al. ............. 269/287 |
| 5,304,278 A * | 4/1994 | Bartha et al. ................ 156/345 |
| 5,700,297 A * | 12/1997 | Vollaro ........................ 269/903 |
| 5,705,225 A * | 1/1998 | Dornfest et al. ......... 427/248.1 |
| 5,842,690 A * | 12/1998 | Lee et al. .................... 269/296 |
| 6,109,602 A * | 8/2000 | Schron, Jr. et al. ......... 269/216 |

OTHER PUBLICATIONS

Patent Abstracts of Japan, vol. 96, No. 1, Jan. 31, 1996; JP 07 240455 A (Nisshinbo Ind), Sep. 12, 1995.
Patent Abstracts of Japan, vol. 16, No. 134 (E–1185) Dec. 26, 1991; JP 03296242 A (Mitsubishi Electric), Dec. 26, 1991.
Patent Abstracts of Japan, vol. 15, No. 22 (E–1024), Jan. 18, 1991; JP 02 268430 A (Tokyo Electron), Nov. 2, 1990.

* cited by examiner

*Primary Examiner*—Joseph J. Hail, III
*Assistant Examiner*—Lee Wilson
(74) *Attorney, Agent, or Firm*—Burns Doane Swecker & Mathis LLP

(57) ABSTRACT

A device that allows the treatment of a substrate in a machine provided for the treatment of bigger substrates and a mounting system for a substrate in this device.

The device comprises a ring (24) having an external diameter equal to the diameter of these substrates, this ring being capable of setting the substrate (22) of smaller diameter. The system includes means (34) of manipulating this substrate and means (36) of heating the ring or of cooling this substrate. Application in micro-electronics.

27 Claims, 3 Drawing Sheets

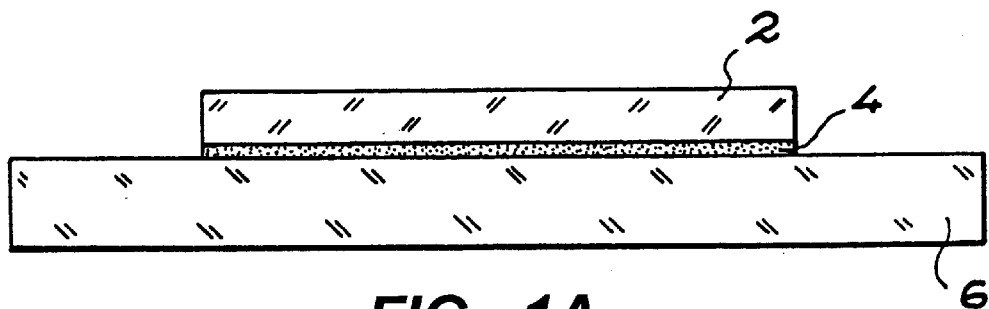
FIG._1A
*(PRIOR ART)*
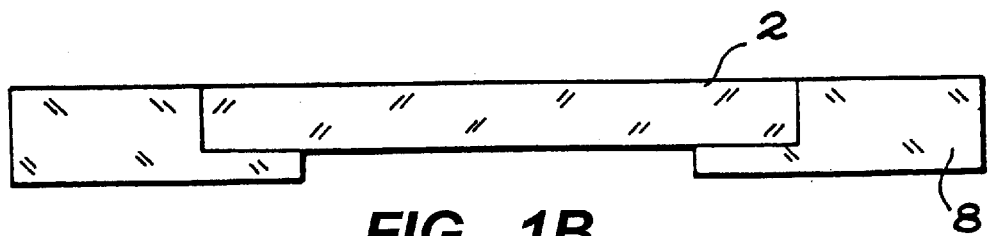
FIG._1B
*(PRIOR ART)*
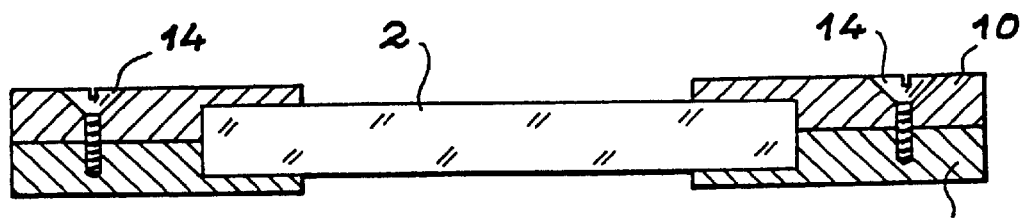
FIG._1C
*(PRIOR ART)*
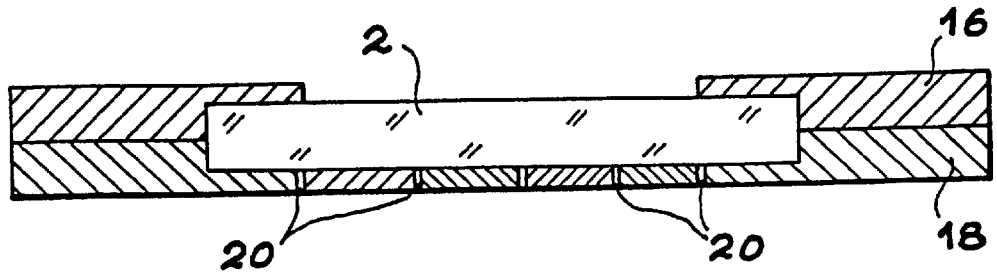
FIG._1D
*(PRIOR ART)*

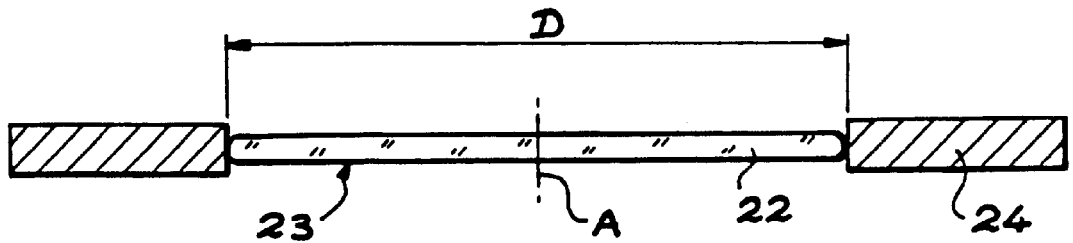
FIG._2
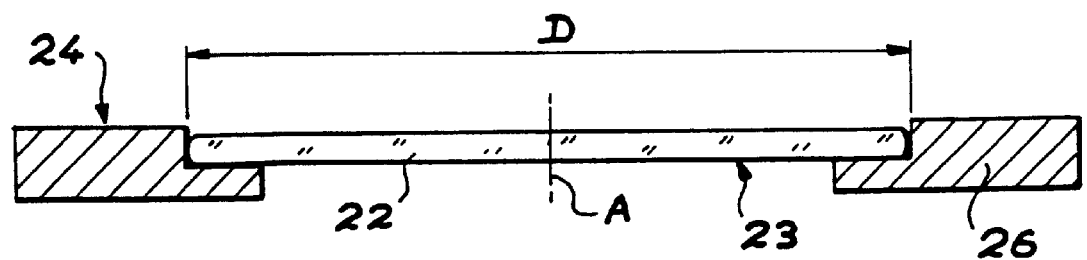
FIG._3
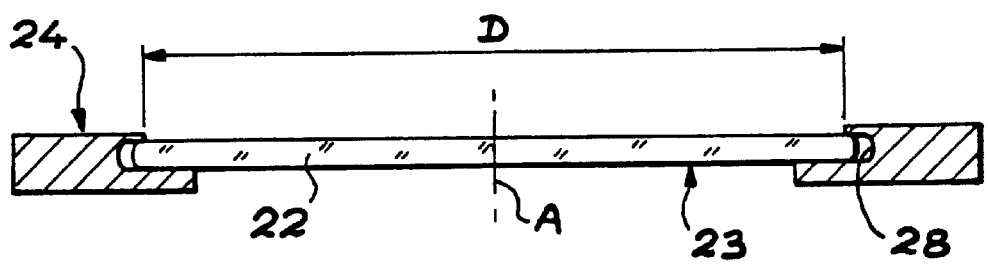
FIG._4

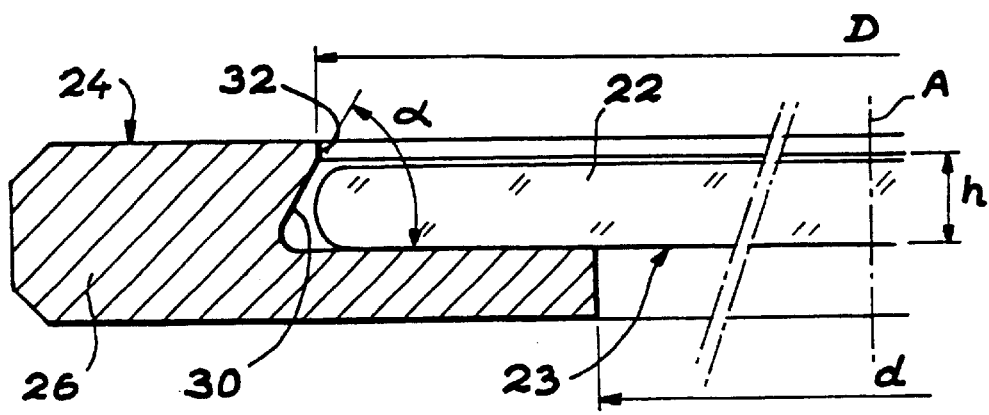
FIG._5
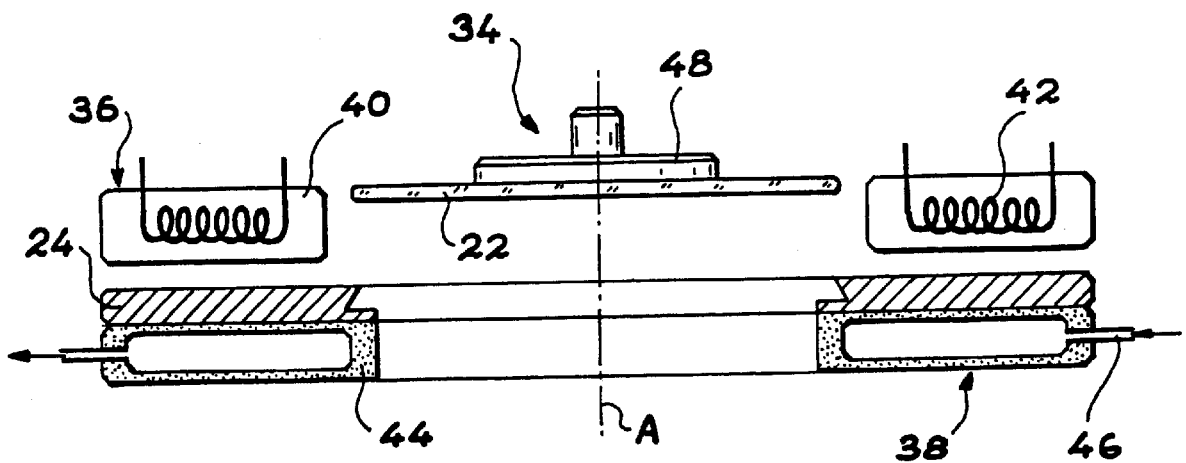
FIG._6

DEVICE ALLOWING THE TREATMENT OF A SUBSTRATE IN A MACHINE PROVIDED FOR THE TREATMENT OF BIGGER SUBSTRATES AND A SYSTEM OF MOUNTING A SUBSTRATE IN THIS DEVICE

TECHNOLOGICAL FIELD

This invention relates to a device called a "lure", that allows treatment of a substrate in a machine provided for the treatment of bigger substrates and a mounting system for a substrate in this device.

It is applied notably in the field of micro-electronics, in the case of the treatment of semiconductor substrates, for example silicon wafers, or ceramic substrates which are, for example, intended for the manufacture of hyper-frequency devices.

STATE OF THE PRIOR TECHNOLOGY

The machines intended for the treatment of silicon wafers are provided to treat wafers, the diameters of which are chosen from among a limited number of diameters or to treat wafers of a single diameter. When one wishes to treat wafers having a diameter less than this diameter, the machines must be modified.

It is also known to manufacture lures (FIGS. 1A to 1D). To do this (FIG. 1A), a silicon wafer 2 having a diameter less than that accepted by a treatment machine can be fixed by means of a layer of adhesive 4 onto another silicon wafer 6 having the diameter that is accepted by the machine. However, out-gassing from the adhesive contaminates the machine.

It is also known to position the wafer 2 in a cutout with an open bottom, formed in a silicon wafer 8 having the diameter accepted by the machine (see FIG. 1B). However, this poses the problem of transporting the lure obtained in this way since the wafer 2 is not held in the cutout. Because of this moreover, it risks being ejected when a plasma is formed in the machine. It is also known (FIG. 1C) to hold the wafer in a stack of two rings 10 and 12 locked one against the other by screws 14, each ring having an external diameter equal to that which is accepted by the machine. However this solution has disadvantages: the stack of rings 10 and 12 and the immobilization of the wafer 2 within them is too difficult to obtain. The wafer risks being scratched and there is a risk of particulate contamination. Furthermore, if the ring 10 is not sufficiently cooled, it can burn the resins painted on the wafer.

It is also known to hold the wafer 2 in a stack of two rings 16 and 18 (FIG. 1D) which are not fixed one to the other and whose external diameter is still equal to the diameter accepted by the machine, the bottom of the lower ring 18 being closed but being provided with small holes 20 that permit passage of a treatment gas. However, this solution has the disadvantage of requiring an upper ring 16 having a weight that is sufficient to prevent the ejection of the wafer 2 during treatment of it by a plasma, which leads to an assembly that is too heavy.

Furthermore, the pressure of the heat-exchange gas (for example helium) generates pressures that correspond to the application of a force of the order of 10N on a wafer of 100 mm diameter. The weight of the ring 16 would therefore have to be greater than this value.

DESCRIPTION OF THE INVENTION

The purpose of this invention is to remedy the preceding disadvantages.

First of all the subject of the invention is a device that allows the treatment of a first, substantially circular substrate, having a first diameter, in a machine provided for the treatment of substrates that are substantially circular, having a second diameter, greater than the first diameter, this device being characterized in that it comprises a ring capable of setting the first substrate, this ring being made of a material which is compatible with the treatments to be carried out in the machine and having an external diameter equal to the second diameter, and an internal diameter less than the first diameter, this ring being capable of expanding sufficiently by heating, or the first substrate being capable of contracting sufficiently by cooling, with the idea of setting this first substrate in the ring.

Preferably, when the first substrate is a semiconductor or ceramic substrate, the ring is capable of expanding sufficiently by heating for such setting to occur.

When the first substrate is a silicon substrate, an anodized aluminum ring or an aluminum ring coated with a layer of protective resin can be used.

According to a preferred embodiment of the device which is a subject of the invention, the ring includes an internal flange capable of holding the first substrate during its treatment in the machine.

Also preferably, in order for the stresses that are liable to be applied to be as weak as possible, the ring includes a cutout formed along the entire length of the internal wall of the ring, which has a shape that is substantially complementary to that of the edge of the first substrate, with a view to it receiving the latter.

For reasons of simplicity of manufacture, in place of such a cutout, it is preferable that the ring includes a cutout formed along the entire length of the internal wall such that when this internal wall is viewed in transverse section, it has the shape of an acute angle, one side of which is perpendicular to the A axis of the ring and which has a value that is sufficiently large to receive the edge of the first substrate.

Preferably this acute angle has a value of approximately 60°.

This invention also relates to a system of mounting the first substrate in the device that is a subject of the invention, characterized in that it comprises:

manipulation means provided to put the first substrate into place in the ring and to move this first substrate when it has been set in this ring and means of heating the ring or of cooling the first substrate so as to be able to set this first substrate in the ring.

In the case where the first substrate is a semiconductor or ceramic substrate, preferably, as has been seen above, a ring is used that is capable of expanding sufficiently on heating for the setting operation to occur. In this case, the system includes means of heating the ring so as to be able to set this first substrate in the ring. These heating means can comprise a retractable crown having an external diameter at least equal to that of the ring and an internal diameter that is greater than the diameter of the first substrate, this crown incorporating resistance heaters. As a complement to the heating means, means intended to cool the ring when the first substrate has been put into place may also be provided.

BRIEF DESCRIPTION OF THE DRAWINGS

This invention will be better understood on reading the description of embodiment examples that are given below, which are purely for information and are in no way limitative, and which make reference to the appended drawings in which:

FIGS. 1A to 1D are diagrammatic transverse section views of known lures,

FIGS. 2 to 5 are diagrammatic transverse section views of particular embodiments of the lure which is a subject of the invention FIG. 6 is a diagrammatic view of a particular embodiment of the mounting system which is a subject of the invention.

DETAILED DESCRIPTION OF PARTICULAR EMBODIMENTS

A substrate formed by a silicon wafer 22 (FIG. 2) is considered that has a diameter D1 (for example equal to 100 mm). It is assumed that one wishes to treat one face 23 (active face) of this wafer in a machine (not shown) provided for the treatment of silicon wafers having a diameter D2 greater than D1, D2 being, for example, equal to 200 mm. Conforming to the principle of this invention, the wafer 22 is held by its edge, using a device called a lure provided for this wafer to be inserted into it and extracted from it without any contamination of the machine or any damage to the device.

This device conforming to the invention includes a ring 24, the external diameter of which is D2 and the internal diameter of which D is less than D1. The wafer is set in this ring 24, the latter being made of a material compatible with the treatment and capable of expanding sufficiently compared with the material of the wafer. Axis A is the axis common to the wafer 22 and the ring 24. The assembly formed by the wafer 22 and the ring 24 then has a diameter D2 that can be accepted by the machine and can therefore be treated in this machine for the treatment of wafer 22. However, there is no tolerance possible with the lure of FIG. 2 since, either the wafer remains under stress or it comes out of the ring during the strong heating that occurs in the course of the treatment.

FIG. 3 is a diagrammatic transverse section view of another device conforming to the invention which improves on that shown in FIG. 2. In the case of FIG. 3, the ring 24 is provided with an internal flange 26 provided to hold the wafer 22 when it and the ring are strongly heated in the course of the treatment. This prevents it coming out of the ring during this treatment. This internal flange 26 also serves to mask the flats of the wafer.

FIG. 4 is a diagrammatic transverse section view of another device conforming to the invention which improves still more on that shown in FIG. 2. In the case of FIG. 4, the ring additionally includes a cutout 28 formed along the entire length of the internal wall of this ring, which has a shape substantially complementary to that of the edge of the wafer 22 (in other words a rounded concave shape in the example shown). This cutout enables one to reduce or indeed eliminate the stresses that are liable to be exerted on the wafer. It can be seen that after setting of the wafer, the wafer moves into this cutout 28 during cooling of the ring. In order to simplify the manufacture of the ring, preferably the cutout 28 is replaced by a cutout 30 which when viewed in transverse section, has substantially the shape of an acute angle α, one side of which is perpendicular to the axis A of the ring and which is sufficiently large to receive the edge of the wafer 22. This is diagrammatically illustrated by FIG. 5 which is a diagrammatic and partial transverse section view of a preferred embodiment of the device which is a subject of the invention. Preferably, this angle is created by forming a 60° chamfer (α=60°), which gives sufficient clearance for the wafer 22.

It can be seen in FIG. 5 that the side of the angle which is not perpendicular to axis A, is extended by a flange 32 parallel to this axis A. The diameter of this flange 32 has a value D slightly less than the diameter of the wafer (at ambient temperature, of the order of 20° C.). On heating the ring 24 to more than 100° C., the ring expands and the wafer 22 can be inserted into it (through the opening defined by flange 32). After cooling, the wafer is captured in the housing bounded by the cutout 30 while being held by the lower flange 26 which prevents the wafer from falling out when the wafer is treated in the machine.

The material chosen to make the ring 24 is rigid, expandable, inert in relation to a plasma, slightly deformable at temperatures of the order of 200° C. and inert to the activated plasma gas. It is known that aluminum is rigid and expandable (coefficient of expansion: 2.4 mm/m/100° C.). However it is not inert to either the gas or the plasma. Hence the material chosen as an example is anodized aluminum or aluminum protected by a layer of resin.

For information purposes only and being in no way limitative, with a silicon wafer 22 of 100 mm±0.50 mm diameter, one uses a ring 24, made of aluminum anodized to a thickness of 30 μm or one made of aluminum coated with a layer of resin identical to the resin painted on the wafer or one coated with a layer of materials compatible with the method and the plasma to a thickness of 1 μm; D=99.90 mm±0.02 mm; the thickness of the ring 24 is 1 mm; the distance h between the top face of the flange 26 and the plane that defines the lower limit of the flange 32 is very slightly greater than the thickness of the wafer which is 0.5 mm; the diameter of the opening bounded by the lower internal flange 26 is 94 mm; the mass of the ring-wafer assembly is of the order of 60 g, a mass which is comparable to that of a silicon wafer of 200 mm diameter.

FIG. 6 is a diagrammatic transverse section view of a system that enables the wafer 22 to be mounted in the ring 24. This system includes a robot 34 for manipulating the wafer and retractable means 36 of heating the ring. The system in FIG. 6 also includes means 38 for cooling the ring after it has been heated. In the example shown, the heating means 36 comprise a retractable crown 40 having an external diameter at least equal to that of the ring and an internal diameter greater than that of the wafer and fitted with electrical resistances 42 for heating the ring by the Joule effect and cooling means 38 including a cooling plate 44 fitted with means 46 of circulating a cooling fluid (gas or liquid) through it.

In order to mount the wafer 22 in the ring 24, one begins by placing the ring on the cooling plate 44. Then the heating crown 40 is positioned facing the ring in order to heat it whereupon it expands. The wafer 22 held in a depression by suitable means 48 with which the robot 34 is fitted, is then positioned in the ring. The crown 36 is then retracted. Cooling fluid is then circulated in the cooling plate 38 in order to cool the ring to ambient temperature. The robot is then used to bring the wafer mounted in the ring to a storage device (not shown).

With a substrate made of a material having an adequate coefficient of contraction, instead of heating the ring, one could cool the substrate in such a way that after heating back up to ambient temperature, this substrate would be set in the ring. The system for mounting the substrate in the ring in this case comprises means for cooling the substrate. The substrate is brought into contact with this cooling means. The substrate contracts sufficiently for one to be able to place it in the ring. The ring-substrate assembly is then heated to bring it back up to ambient temperature. The substrate is then held in the ring and can be transported by a manipulating robot to a storage device.

What is claimed is:

1. A device for treatment of a substantially circular first substrate having a first diameter in a machine provided for the treatment of substantially circular substrates having a second diameter greater than the first diameter, the device comprising:
   a ring, the ring being defined by a generally circular structure having an aperture disposed therethrough, wherein the ring has an external diameter equal to the second diameter and an internal diameter less than the first diameter, wherein the ring expands upon heating to receive the substantially circular first substrate within the first diameter.

2. The device according to claim 1, wherein the first substrate is a semiconductor substrate.

3. The device according to claim 2, wherein the first substrate is a silicon substrate.

4. The device according to claim 1, wherein the ring includes a flange, the flange being disposed radially within the aperture, wherein said flange is capable of retaining the first substrate.

5. The device according to claim 1, wherein the ring includes a groove disposed radially about the inner circumference of the internal wall of the ring, wherein the groove is adapted having a shape complementary to that of the edge of the first substrate.

6. The device according to claim 1, wherein the ring further includes a groove formed along the circumference of the internal wall of the ring, the groove being disposed at an acute angle, relative to a perpendicular axis of the ring.

7. The device according to claim 6, wherein the acute angle is approximately 60°.

8. The device according to claim 1, wherein the first substrate is constructed of ceramic.

9. The device according to claim 1, wherein the ring is constructed of a material chosen from the group consisting of: aluminum coated with a layer of protective resin, aluminum, anodized aluminum.

10. The device according to claim 1, wherein the ring is made of a material having a coefficient of expansion which is about 2.4 mm/m/100° C.

11. An apparatus for treatment of a first substrate having a first diameter in a machine provided for the treatment of substantially circular substrates having a second diameter greater than the first diameter, the apparatus comprising:
   a ring, the ring being defined by a generally circular structure having an aperture disposed therethrough, wherein the ring has an external diameter equal to the second diameter and an internal diameter less than the first diameter, wherein the ring expands upon heating at a rate of about 2.4 mm/m/100° C. to receive the substantially circular first substrate within the first diameter; and
   a manipulation means for disposing the first substrate within the internal diameter of the ring, wherein the first substrate is fixed within the internal diameter of the ring by first heating the ring with a heating means so as to expand the ring to receive the substrate within the internal diameter.

12. An apparatus for treatment of a semiconductor substrate having a first diameter in a machine provided for the treatment of substantially circular semiconductor substrates having a second diameter greater than the first diameter, the apparatus comprising:
   a ring, the ring being defined by a generally circular structure having an aperture disposed therethrough, wherein the ring has an external diameter equal to the second diameter and an internal diameter less than the first diameter, wherein the ring expands upon heating at a rate of about 2.4 mm/m/100° C. to receive the substantially circular semiconductor substrate within the first diameter; and
   a manipulation means for disposing the semiconductor substrate within the internal diameter of the ring, wherein the semiconductor substrate is fixed within the internal diameter of the ring by first heating the ring with a heating means so as to expand the ring to receive the substrate within the internal diameter.

13. The apparatus according to claim 12, wherein the means of heating the ring includes a retractable crown having an external diameter at least equal to that of the ring and an internal diameter which is greater than the diameter of the semiconductor substrate.

14. The apparatus according to claim 12, further including cooling means for cooling the ring after the semiconductor substrate has been positioned.

15. A method for mounting a substrate for processing, the method including:
   placing the substrate into a ring, wherein the ring has a first diameter and a second diameter, the second diameter being smaller than the diameter of the substrate; and
   heating the ring thereby causing the ring to expand, whereby when expanded the second diameter is adapted to receive the substrate.

16. A method for mounting a substrate within a device for processing, the method including:
   disposing a substrate within a ring, wherein the ring has a first diameter defined by an aperture and a second diameter, the second diameter being greater than the first diameter and sized to be accepted within a substrate processing device; and
   heating the ring with a heating device, the material from which the ring is constructed expands in response to the heating, whereby the first diameter of the ring expands to accept the substrate.

17. The method according to claim 16, further including the step of cooling the ring after heating thereby fixedly attaching the substrate within the first diameter.

18. The method according to claim 17, wherein the material from which the ring is constructed is chosen from the group consisting of: aluminum, anodized aluminum, and epoxy coated aluminum.

19. The method according to claim 18, wherein the substrate is chosen from the group consisting of: silicon, ceramic, semiconductor substrate.

20. The method according to claim 17, wherein the substrate is disposed within the ring by a manipulation device.

21. The method according to claim 20, wherein the manipulation device is a robot.

22. The method according to claim 16, wherein the heating device includes a retractable crown ring having an external diameter at least equal to the second diameter of the ring and an internal diameter which is greater than the diameter of the substrate.

23. The method according to claim 16, further including a cooling means for cooling the ring after the substrate has been disposed within said aperture.

24. An apparatus for treatment of a first substrate having a first diameter in a machine provided for the treatment of substantially circular substrates having a second diameter greater than the first diameter, the apparatus comprising:

a ring, the ring being defined by a generally circular structure having an aperture disposed therethrough, wherein the ring has an external diameter equal to the second diameter and an internal diameter less than the first diameter; and a manipulation means for disposing a substrate within the internal diameter of the ring, wherein the first substrate is fixed within the internal diameter of the ring by first cooling the substrate with a cooling means so as to contract the substrate such that the substrate will be received within the internal diameter of the ring.

25. The apparatus according to claim 24, wherein the substrate is a semiconductor substrate.

26. The apparatus according to claim 24, wherein the substrate is a ceramic substrate.

27. A device for treatment of a substantially circular first substrate, having a first diameter, in a machine provided for the treatment of substantially circular substrates having a second diameter greater than the first diameter, the device comprising:

a ring, the ring being defined by a generally circular structure having an aperture disposed therethrough, wherein the ring has an external diameter equal to the second diameter, and an internal diameter less than the first diameter, wherein the first diameter of the substrate contracts upon cooling to be received within the aperture of the ring.

* * * * *